United States Patent
Okada et al.

(10) Patent No.: US 9,684,015 B2
(45) Date of Patent: Jun. 20, 2017

(54) MEASURING APPARATUS AND MEASURING METHOD UTILIZING INSULATING LIQUID

(71) Applicant: Mitsubishi Electric Corporation, Tokyo (JP)

(72) Inventors: Akira Okada, Tokyo (JP); Takaya Noguchi, Tokyo (JP); Kosuke Hatozaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 216 days.

(21) Appl. No.: 14/644,920

(22) Filed: Mar. 11, 2015

(65) Prior Publication Data
US 2015/0362527 A1    Dec. 17, 2015

(30) Foreign Application Priority Data
Jun. 17, 2014    (JP) ................................ 2014-124499

(51) Int. Cl.
*G01R 31/20*    (2006.01)
*G01R 1/44*    (2006.01)
(Continued)

(52) U.S. Cl.
CPC ............... *G01R 1/44* (2013.01); *G01R 1/04* (2013.01); *G01R 1/06722* (2013.01)

(58) Field of Classification Search
CPC .. G01R 1/44; G01R 1/06711; G01R 1/06794; G01R 1/0408; G01R 1/06777;
(Continued)

(56) References Cited

U.S. PATENT DOCUMENTS 5,285,351 A * 2/1994 Ikeda ................... H01L 23/433
165/104.33
8,610,446 B2 * 12/2013 Yoshida ............... G01R 31/129
324/464
(Continued)

FOREIGN PATENT DOCUMENTS

JP    S64-008640 A    1/1989
JP    H05-288801 A    11/1993
(Continued)

OTHER PUBLICATIONS

An Office Action; "Notification of Reason for Rejection," issued by the Japanese Patent Office on Nov. 22, 2016, which corresponds to Japanese Patent Application No. 2014-124499 and is related to U.S. Appl. No. 14/644,920; with English language partial translation.

Primary Examiner — Minh N Tang
(74) Attorney, Agent, or Firm — Studebaker & Brackett PC

(57) ABSTRACT

A measuring apparatus includes a stage on which an object to be measured is placed, an insulating base plate, a probe fixed on the insulating base plate, a measuring unit which measures an electrical characteristic of the object to be measured through the probe, a side wall part having such a shape as to surround the probe and smaller in width than the stage, and a supply tube through which an insulating liquid is supplied, wherein when an electrical characteristic of the object to be measured is measured, the stage, the side wall part and the insulating base plate form a measurement region surrounding the object to be measured, and the insulating liquid is applied from the supply tube to the object to be measured in the measurement region.

19 Claims, 13 Drawing Sheets

(51) Int. Cl.
*G01R 1/04* (2006.01)
*G01R 1/067* (2006.01)

(58) Field of Classification Search
CPC .......... G01R 1/07314; G01R 1/07371; G01R 31/2601; G01R 31/2808; G01R 31/2886; G01R 31/2623; G01R 31/2891; G01R 31/2874; G01R 31/2875; G01R 31/2862
See application file for complete search history.

(56) References Cited

U.S. PATENT DOCUMENTS

| | | | |
|---|---|---|---|
| 2007/0247177 A1* | 10/2007 | Ruckenbauer | G01R 31/2891 324/750.19 |
| 2007/0290702 A1* | 12/2007 | Lee | G01R 31/311 324/750.03 |
| 2011/0031990 A1* | 2/2011 | Patterson | G01R 1/0408 324/755.05 |
| 2013/0106453 A1 | 5/2013 | Ikegami | |
| 2015/0115989 A1* | 4/2015 | Okada | G01R 31/2808 324/754.03 |

FOREIGN PATENT DOCUMENTS

| | | |
|---|---|---|
| JP | 2007-142246 A | 6/2007 |
| JP | 2012-191083 A | 10/2012 |
| JP | 2013-096837 A | 5/2013 |
| WO | 2010/021070 A1 | 2/2010 |

* cited by examiner

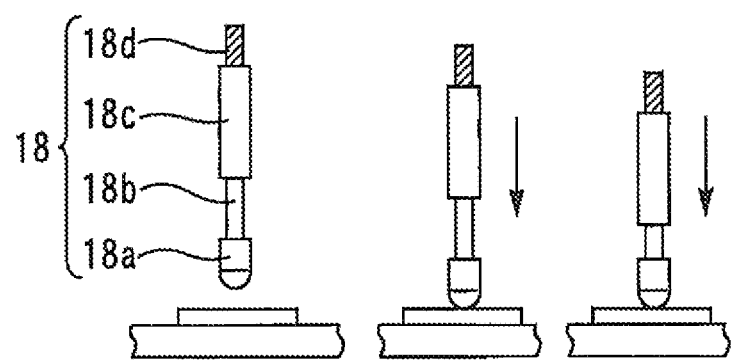
FIG.3A  FIG.3B  FIG.3C
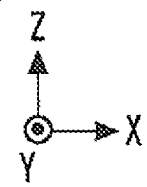
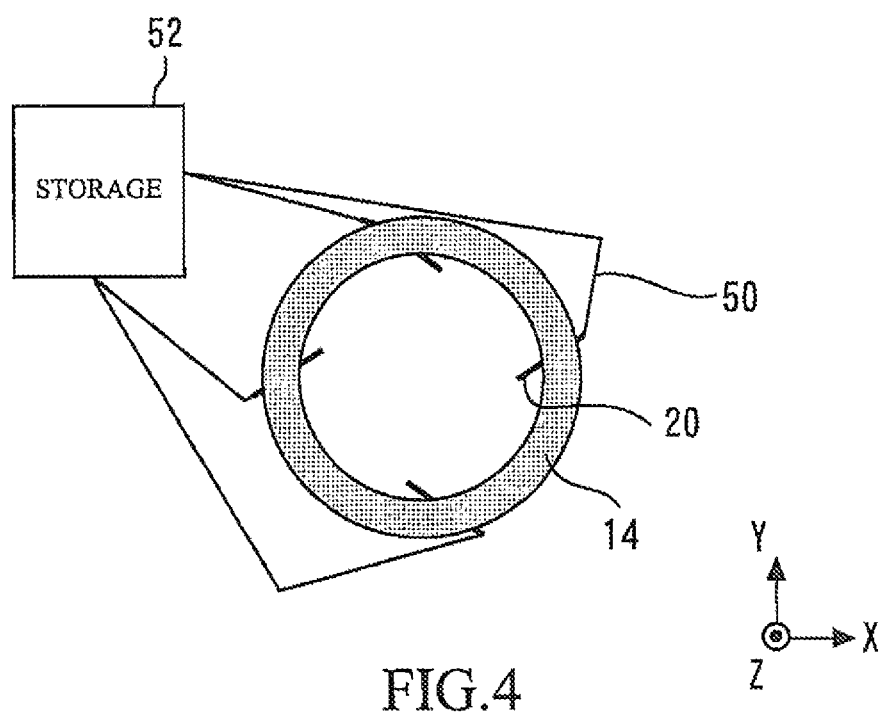
FIG.4

MEASURING APPARATUS AND MEASURING METHOD UTILIZING INSULATING LIQUID

BACKGROUND OF THE INVENTION

Field of the Invention

The present invention relates to a measuring apparatus and method for measuring an electrical characteristic of an object to be measured by bringing a probe into contact with the object to be measured.

Background Art

Japanese Patent Laid-Open No. 2007-142246 discloses a technique to measure an electrical characteristic of a wafer by applying a liquid having an electrical insulating characteristic.

In a case where an electrical characteristic of an object to be measured is measured by bringing a probe into contact with the object to be measured, it is preferable to limit discharge by applying an insulating liquid to the object to be measured. In the measuring apparatus disclosed in Japanese Patent Laid-Open No. 2007-142246, however, an insulating liquid is retained with an annular retaining member provided on a side surface of a stage. With the measuring apparatus, therefore, there is a problem that a large amount of the insulating liquid is required. There is also a problem of the insulating liquid penetrating to a back surface of the object to be measured.

SUMMARY OF THE INVENTION

In view of the above-described problems, an object of the present invention is to provide a measuring apparatus and method capable of reducing the amount of an insulating liquid used and inhibiting penetration of the insulating liquid to a back surface of an object to be measured.

The features and advantages of the present invention may be summarized as follows.

According to one aspect of the present invention, a measuring apparatus includes a stage on which an object to be measured is placed, an insulating base plate, a probe fixed on the insulating base plate, a measuring unit which measures an electrical characteristic of the object to be measured through the probe, a side wall part having such a shape as to surround the probe and smaller in width than the stage, and a supply tube through which an insulating liquid is supplied, wherein when an electrical characteristic of the object to be measured is measured, the stage, the side wall part and the insulating base plate form a measurement region surrounding the object to be measured, and the insulating liquid is applied from the supply tube to the object to be measured in the measurement region.

According to another aspect of the present invention, a method of measuring an object to be measured includes the steps of placing on a stage an object to be measured in which a plurality of elements each having an upper electrode are formed, bringing a lower surface of a side wall part surrounding, as viewed in plan, an elemental measurement object which is not all of the plurality of elements but at least one of the elements into contact with a peripheral portion of the elemental measurement object so that the upper electrode of the elemental measurement object is surrounded with the side wall part and an insulating base plate maintained in contact with the upper surface of the side wall part, and bringing a probe fixed on the insulating base plate into contact with the upper electrode of the elemental measurement object, applying an insulating liquid to the elemental measurement object, and measuring an electrical characteristic of the elemental measurement object with a measuring unit electrically connected to the probe.

Other and further objects, features and advantages of the invention will appear more fully from the following description.

BRIEF DESCRIPTION OF THE DRAWINGS

FIGS. 3A, 3B, and 3C illustrate a spring-type probe;

FIG. 4 is a plan view of components including the side wall part;

DETAILED DESCRIPTION OF THE PREFERRED EMBODIMENTS

Figure 1:
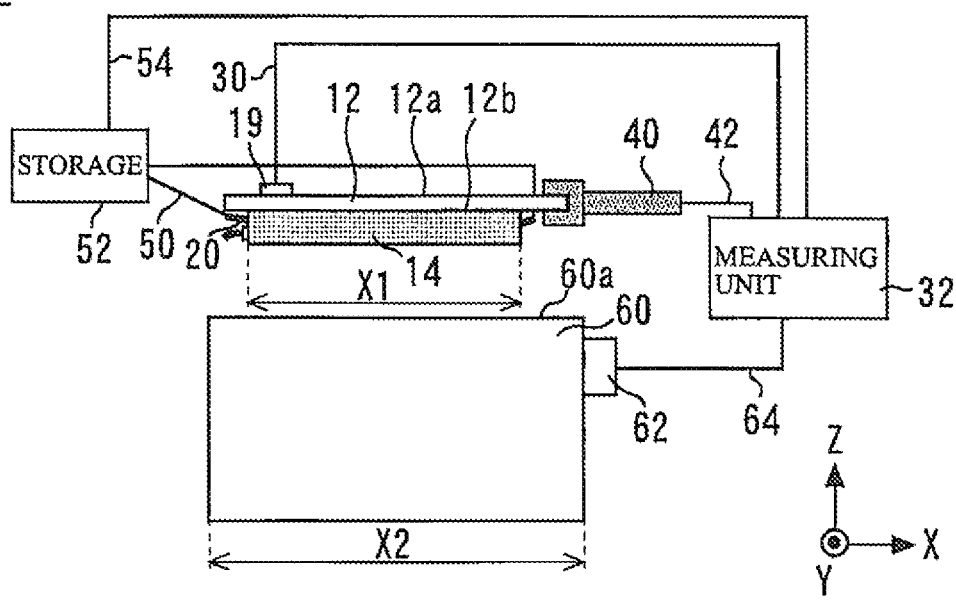
FIG. 1 is a front view of a measuring apparatus according to a first embodiment.

A measuring apparatus and a measuring method according to an embodiment of the present invention will be described with reference to the drawings. Components identical or corresponding to each other are indicated by the same reference characters and repeated description of them is avoided in some cases.

First Embodiment

FIG. 1 is a front view of a measuring apparatus 10 according to a first embodiment of the present invention. The measuring apparatus 10 is provided with an insulating base plate 12 having an upper surface 12a and a lower surface 12b. A side wall part 14 formed into a cylindrical shape is fixed on the lower surface 12b of the insulating base plate 12. The material of the side wall part 14 is not particularly specified but it is an insulating material, e.g., a PPS resin. The side wall part 14 is fixed on the insulating base plate 12, with an upper surface of the side wall part 14 being in contact with the insulating base plate 12. It is preferable that the side wall part 14 be fixed on the insulating base plate 12 by a method which enables the side wall part 14 to be detached from the insulating base plate 12. Such a method is, for example, fastening with screws or engagement.

Figure 2:
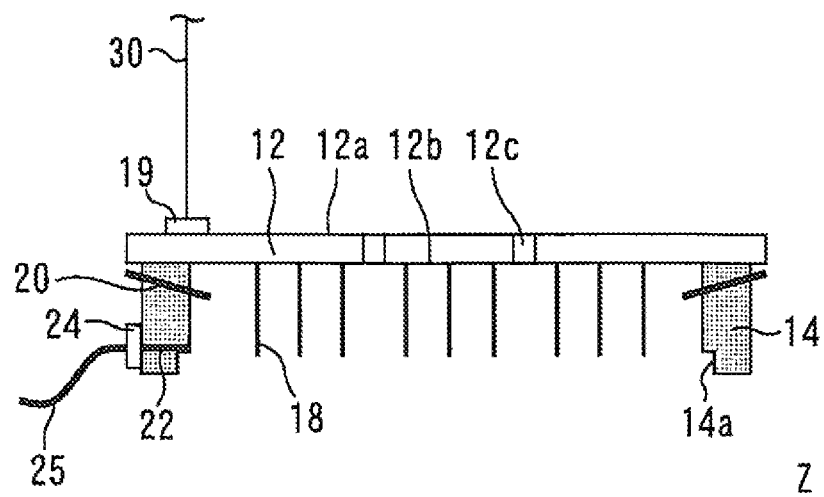
FIG. 2 is a sectional view of components including the insulating base plate and the side wall part.

FIG. 2 is a sectional view of components including the insulating base plate 12 and the side wall part 14. A through hole 12c is formed in the insulating base plate 12. A plurality of probes 18 are fixed on the lower surface 12b of the insulating base plate 12. The material of the probes 18 is not particularly specified but it has electrical conductivity. The material of the probes 18 is, for example, a metallic material typified by copper, tungsten or rhenium-tungsten. The probes 18 may also be coated with gold, palladium, tantalum or platinum for example.

The probes 18 may be cantilever-type probes, spring-type probes slidable along a Z-direction, multilayer probes or wire probes for example. FIG. 3 illustrates a spring-type probe 18. This probe 18 has a contact portion 18a to be brought into contact with an object to be measured, an extensible portion 18b capable of being extended along the Z-direction by a spring or the like, a main body 18c, and a connecting portion 18d serving as a portion for output to an external point. When the probe 18 is brought closer to an object to be measured from a state shown in FIG. 3A, the contact portion 18a and the object to be measured contact each other, as shown in FIG. 3B. When the probe 18 is further moved in the negative Z-direction, the extensible portion 18b is retracted, thereby improving the reliability of contact between the contact portion 18a and the object to be measured (FIG. 3C).

As shown in FIG. 2, a connecting portion 19 electrically connected to the probes 18 is provided on the upper surface 12a of the insulating base plate 12. The probes 18 and the connecting portion 19 are connected, for example, by a metal plate provided on the upper surface 12a of the insulating base plate 12.

The side wall part 14 has such a shape as to surround the probes 18. A stepped portion 14a is provided in a lower surface of the side wall part 14. The stepped portion 14a is formed of a cut in a lower end portion of the side wall part 14. More specifically, the side wall part 14 is formed so as to be shorter at the inner side (a portion closer to the probes 18) and longer at the outer side (a portion remoter from the probes 18) and therefore has the stepped portion 14a.

A supply tube 20 through which an insulating liquid is supplied is provided in the side wall part 14. A discharge tube 22 through which the insulating liquid is discharged is provided in the side wall part 14 by being positioned lower than the supply tube 20. The discharge tube 22 is opened/closed by an opening/closing valve 24. Then the opening/closing valve 24 is opened, the discharge tube 22 communicates with a hose 25.

Referring back to FIG. 1, the connecting portion 19 is connected to a measuring unit 32 by a signal line 30. The measuring unit 32 is a part for performing, for example, measurement of an electrical characteristic of an object to be measured. The measuring apparatus 10 has an arm 40 for moving the insulating base plate 12 in an arbitrary direction. The arm 40 is connected to the measuring unit 32 by a signal line 42. The operation of the arm 40 is controlled by the measuring unit 32. Also, one insulating base plate 12 may be moved by a plurality of arms 40.

The supply tube 20 is connected to a storage 52 in which the insulating liquid is stored through the hose 50. The insulating liquid is not particularly specified but it has an electrically insulating property. The insulating liquid is, for example, a fluorine-based inert liquid such as Fluorinert (trademark), Novec (trademark) or EF-L, silicone oil or sulfur hexafluoride. The storage 52 is connected to the measuring unit 32 by a signal line 54. The storage 52 receives a command from the measuring unit 32 through the signal line 54 and supplies the insulating liquid to the hose 50 and the supply tube 20 according to the command.

The measuring apparatus 10 is provided with a stage 60 having an upper surface 60a. The stage 60 is constructed so that an object to be measured is placed on the upper surface 60a and fixed by vacuum attraction means, electrostatic attraction means or the like. A connecting portion 62 electrically connected to the stage 60 is provided on a side surface of the stage 60. The connecting portion 62 is connected to the measuring unit 32 through the signal line 64. The measuring unit 32 is therefore connected electrically to the stage 60. As is apparent from FIG. 1, the width X1 of the side wall part 14 is smaller than the width X2 of the stage 60.

FIG. 4 is a plan view of components including the side wall part 14. The side wall part 14 is formed into an annular (cylindrical) shape. Therefore, the inner wall surface of the side wall part 14 is a curved surface. A plurality of supply tubes 20 are fixed at equal intervals in the side wall part 14. The plurality of supply tubes 20 are not perpendicular to the inner wall surface of the side wall part 14 but at an acute angle from the inner wall surface.

Figure 5:
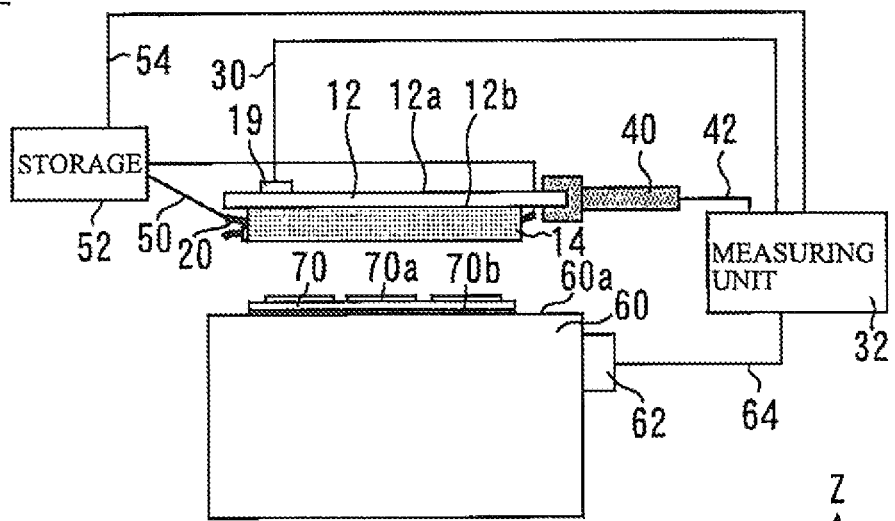
FIG. 5 is front view of components including an object to be measured.

A method of measuring an electrical characteristic of an object to be measured with the measuring apparatus 10 will be described. The plurality of probes 18 are first made uniform in parallelism. Subsequently, an object to be measured 70 is placed on the upper surface 60a of the stage 60, as shown in FIG. 5. This step is referred to as a mount step. A plurality of elements are formed in the object to be measured 70. Each element is a vertical-type element having an upper electrode 70a and a lower electrode 70b and having a current caused to flow in a vertical direction between the electrodes. When the mount step is completed, the lower electrode 70b is in contact with the stage 60.

Figure 6:
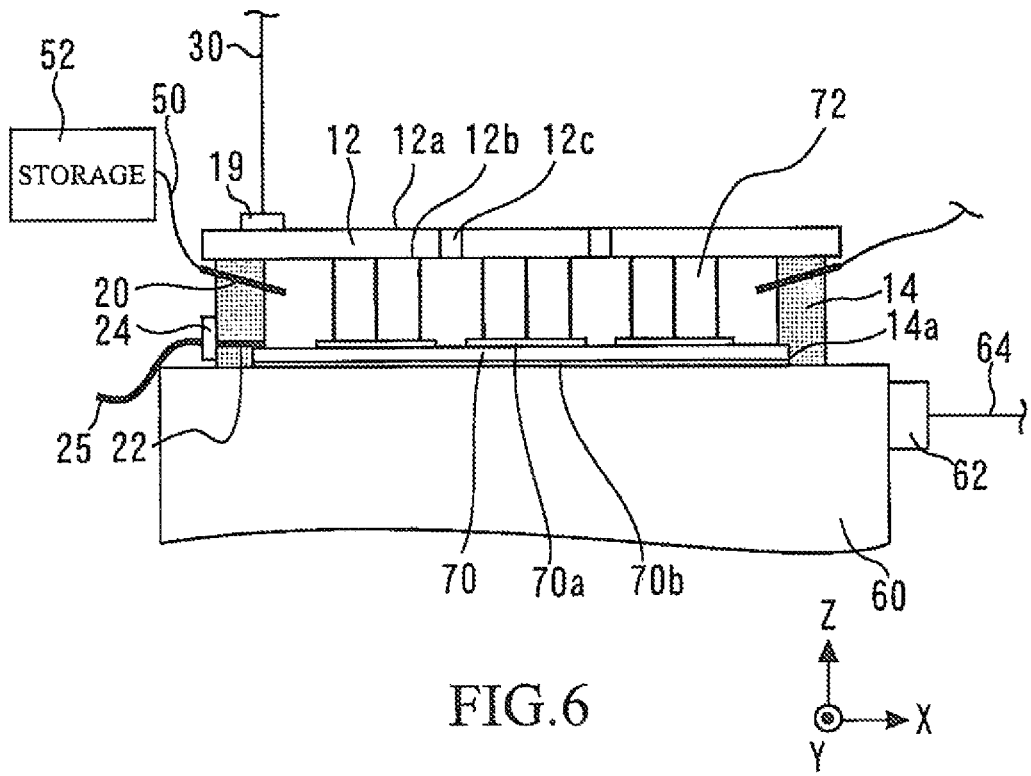
FIG. 6 is a sectional view including portions of the measuring apparatus after the contact step.

After the completion of the mount step, the process advances to a contact step. FIG. 6 is a sectional view including portions of the measuring apparatus after the contact step. In the contact step, the measuring unit 32 moves the arm 40 holding the insulating base plate 12 in the negative Z-direction. The probe 18 is thereby brought into contact with the upper electrode 70a. Preferably, at this time, the probes are brought into contact with all the upper electrodes 70a of the elements to be obtained as a product. Preferably, if a large current is applied to one of the elements in the object to be measured 70, a plurality of probes 18 are brought into contact with the one upper electrode 70a as shown in FIG. 6.

It is preferable that the current density in the plurality of probes 18 at the time of measurement be generally uniform. Therefore, the connecting portions 19 and 62 are provided at such positions that the plurality of probes 18 are interposed between the connecting portion 19 and the connecting portion 62, thereby generally equalizing the distances from the connecting portion 19 to the connecting portion 62 via the plurality of probes 18.

In the contact step, the outer side of the side wall part 14 is brought into contact with the stage 60, with the probes 18 brought into contact with the upper electrodes 70a. The stepped portion 14a is provided in the side wall part 14. Inner portions of the side wall part 14 can therefore contact a peripheral upper surface portion and a side surface of the object to be measured 70. A measurement region 72 is thereby formed where the object to be measured 70 is surrounded with the stage 60, the side wall part 14 and the insulating base plate 12.

Figure 7:
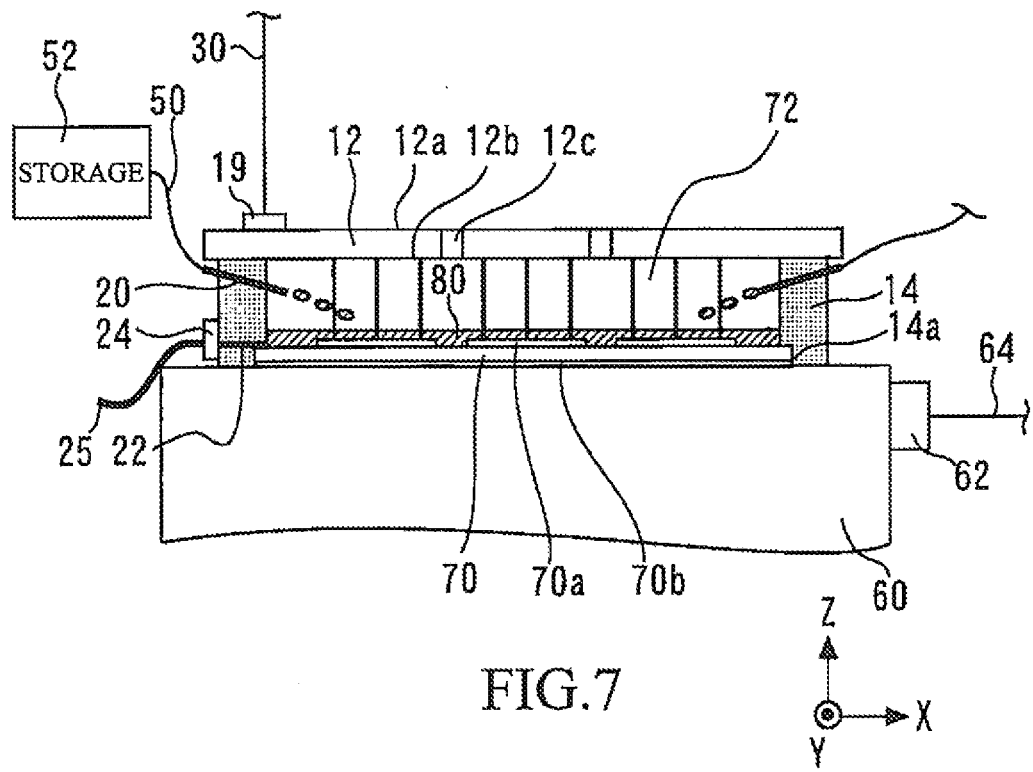
FIG. 7 is a sectional view including portions of the measuring apparatus during the application step.

After the completion of the contact step, the process advances to an application step. FIG. 7 is a sectional view including portions of the measuring apparatus during the application step. In the application step, the storage 52 having received a command from the measuring unit 32 releases the insulating liquid into the hose 50. The insulating liquid is thereby applied from the supply tubes 20 to the object to be measured 70 in the measurement region 72, as indicated at 80. At this time, since the plurality of supply tubes 20 are at an acute angle from the inner wall surface of the side wall part 14, vortices of the insulating liquid 80 are formed in the measurement region 72, so that the insulating liquid 80 is uniformly applied to the entire object to be measured 70. Also, the through hole 12c in the insulating base plate 12 serves to prevent the pressure in the measurement region 72 from being increased by the supply of the insulating liquid to the measurement region 72.

After the completion of the application step, the process advances to a measuring step. In the measuring step, the measuring unit 32 measures an electrical characteristic of the object to be measured 70 through the probes 18. More specifically, the measuring unit 32 causes a current to flow through the circuit formed by the signal line 30, the connecting portion 19, the probes 18, the object to be measured 70, the stage 60, the connecting portion 62 and the signal line 64 or applies a voltage to the circuit.

Figure 8:
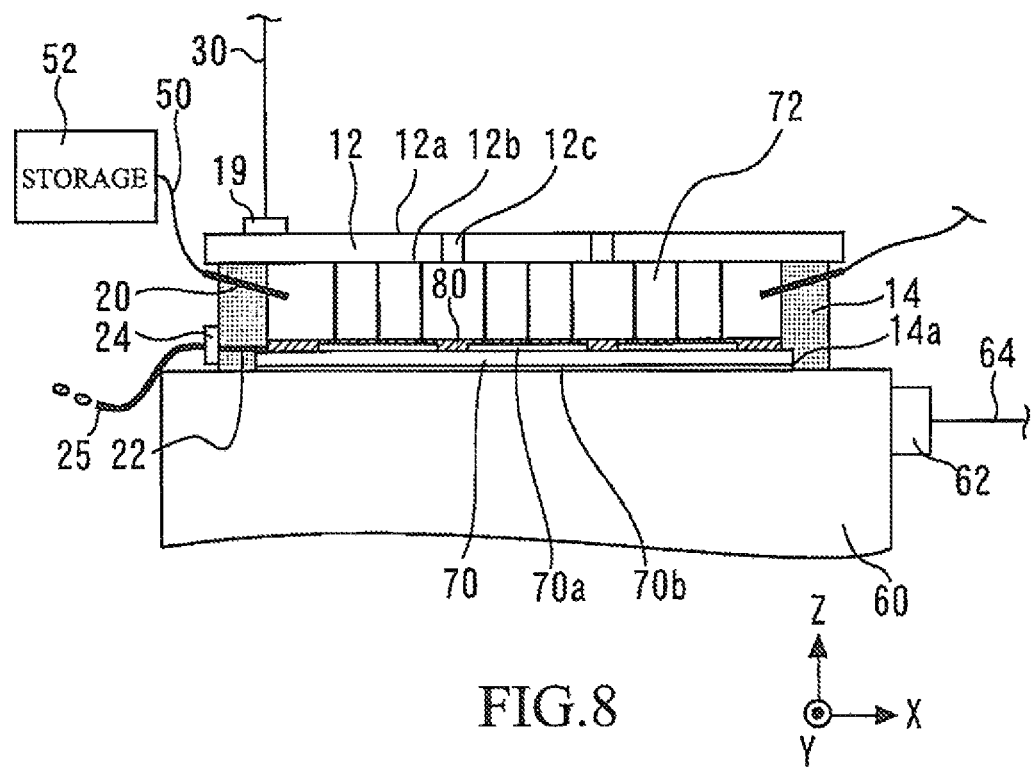
FIG. 8 is a sectional view including portions of the measuring apparatus during the discharge step.

After the completion of the measuring step, the process advances to a discharge step. FIG. 8 is a sectional view including portions of the measuring apparatus during the discharge step. In the discharge step, the opening/closing valve 24 is opened to discharge the insulating liquid 80 out of the measurement region 72 through the discharge tube 22 and the hose 25.

Electric discharge at the time of measurement of an electrical characteristic of the object to be measured 70 can occur not only on the upper electrodes 70a but also on the peripheries of the upper electrodes 70a. However, the application of the insulating liquid 80 to the object to be measured 70 enables prevention of electric discharge in the measuring step for measuring an electrical characteristic of the object to be measured in the measuring apparatus and the measuring method according to the first embodiment of the present invention.

Because an outer circumferential portion (e.g., a beveled portion) of the object to be measured 70 and the side wall part 14 contact each other, the insulating liquid is supplied onto the object to be measured 70 only. Therefore, the amount of the insulating liquid used can be reduced in comparison with the invention in Japanese Patent Laid-Open No. 2007-142246 wherein an insulating liquid is supplied to the entire stage surface.

The stepped portion 14a is provided in the side wall part 14 to enable the side wall part 14 to contact the object to be measured 70 and the stage 60. The insulating liquid 80 in the measurement region 72 can therefore be inhibited from penetrating to the back surface of the object to be measured 70. Further, a portion (an inner side portion) of the side wall part 14 is placed on the object to be measured 70 to press the object to be measured 70 against the stage 60 so that the object to be measured 70 and the stage 60 are maintained in close contact with each other. The contact resistance between the object to be measured 70 and the stage 60 can thereby be reduced and penetration of the insulating liquid to a gap between the object to be measured 70 and the stage 60 can also be prevented.

Forming the inner wall surface of the side wall part 14 into a curved shape enables inhibition of charge concentration which is a cause of electric discharge. To inhibit charge concentration, the side wall part 14 may be formed so that its inner wall surface has no angled portions.

The measuring apparatus 10 can easily be manufactured by only fixing to the insulating base plate 12 the side wall part 14 in which the supply tubes 20 and the discharge tube 22 are mounted. Therefore, the existing insulating base plate 12 can be used without being changed.

The measuring apparatus and the measuring method according to the first embodiment of the present invention can be variously modified. For example, in the application and measuring steps, the side wall part 14 may be pressed toward the stage 60 to prevent the insulating liquid from leaking out of the measurement region 72. More specifically, a force is applied from the arm 40 to the insulating base plate 12 in a direction toward the stage 60 or a force is applied to the insulating base plate 12 in a direction toward the stage 60 by pressing a pressing member against the insulating base plate, thereby pressing the side wall part 14 toward the stage 60.

A portion of the side wall part including the bottom surface of the side wall part may be formed of an elastic material such that the side wall part is maintained in close contact with the stage 60 and the object to be measured 70 with no gaps formed therebetween. The side wall part may be formed without any stepped portion and the entire bottom surface of the side wall part may be brought into contact with the object to be measured. The elements formed in the object to be measured are not limited to vertical-type elements. Each of the elements may alternatively be a lateral-type element having a current input and a current output its upper surface. The stage may be moved in any direction while the insulating base plate 12 is fixed.

Figure 9:
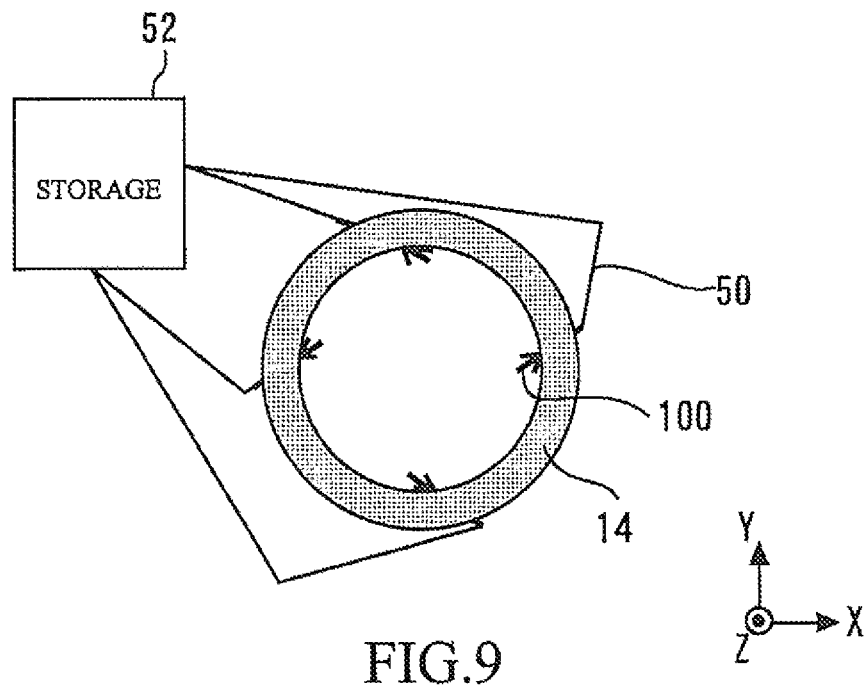
FIG. 9 shows an example of modification of the supply tubes.

The number of supply tubes 20, the layout of the supply tubes 20 and the angles of the supply tubes 20 from the inner wall surface are not particularly specified as long as the insulating liquid can be applied to the entire object to be measured 70. FIG. 9 is a plan view of supply tubes and other components representing an example of modification of the supply tubes. An inner portion of one supply tube 100 is branched into three. Nonuniformity of application of the insulating liquid can be reduced by branching outlet end portion of each supply tube 100 into a plurality portions in this way.

These modifications can also be applied as desired to measuring apparatuses and measuring methods according to embodiments described below. The measuring apparatuses and the measuring methods in the embodiments described below correspond in many respects to the first embodiment and will therefore be described mainly with respect to points of difference from the first embodiment.

Second Embodiment

Figure 10:
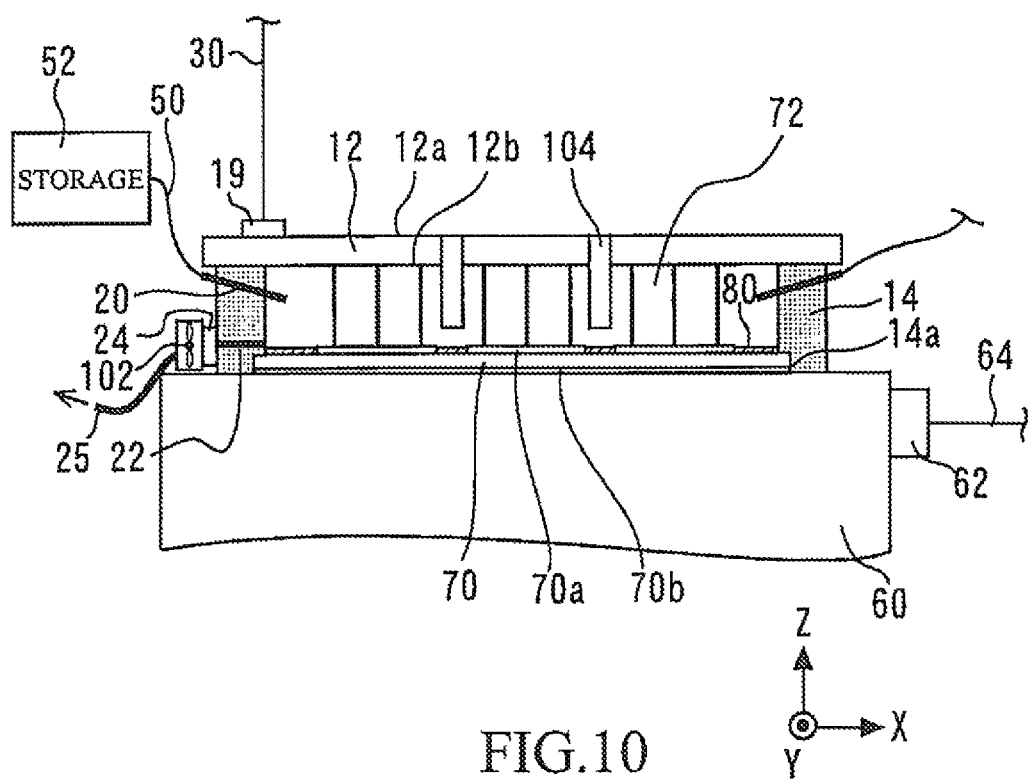
FIG. 10 is a sectional view showing a measuring apparatus according to the second embodiment.

FIG. 10 is a sectional view showing a state where the discharge step is executed by using a measuring apparatus according to the second embodiment. A volatile insulating liquid is stored in the storage 52. An exhaust fan 102 for exhausting a gas in the discharge tube 22 is fixed to the opening/closing valve 24. The exhaust fan 102 is connected to the measuring unit 32 and on/off-controlled by the measuring unit 32.

An external air introducing tube 104 extending from the insulating base plate 12 toward the object to be measured 70 is mounted in the insulating base plate 12. The lower end of the external air introducing tube 104 is closer to the object to be measured 70 than the lower surface 12b of the insulating base plate 12.

In the discharge step, the opening/closing valve 24 is opened and the exhaust fan 102 is operated, thereby exhausting vapor of the insulating liquid out of the measurement region 72 through the discharge tube 22, the opening/closing valve 24, the exhaust fan 102 and the hose 25. At this time, evaporation of the insulating liquid can be promoted by applying to the insulating liquid a gas introduced into the measurement region 72 from the external air introducing tube 104 because the lower end of the external air introducing tube 104 is near the object to be measured 70.

Thus, in the discharge step in the second embodiment, external air is supplied into the measurement region 72 through the external air introducing tube 104 to evaporate the insulating liquid and exhaust vapor of the insulating liquid out of the measurement region 72. Needless to say, the insulating liquid in the liquid state and vapor of the insulating liquid may be simultaneously discharged. A process is also conceivable in which the insulating liquid in the liquid state is discharged before the evaporation of the insulating liquid progresses to a certain extent, and vapor of the insulating liquid is exhausted after the evaporation has progressed to the certain extent.

The supply tubes 20 and the discharge tube 22 may be provided in the insulating base plate 12. Since the supply tubes 20 and the discharge tube 22 are not simultaneously used, a common tube to be used in common as supply tube 20 and as discharge tube 22 may be provided. That is, the common tube may be connected to the storage 52 when the insulating liquid is supplied to the measurement region 72, and connected to the exhaust fan 102 when the gas is exhausted. In such a case, there is a need for a switching part for connecting the common tube to the storage 52 or the exhaust fan 102. The switching part is under the control of the measuring unit 32.

Third Embodiment

Figure 11:
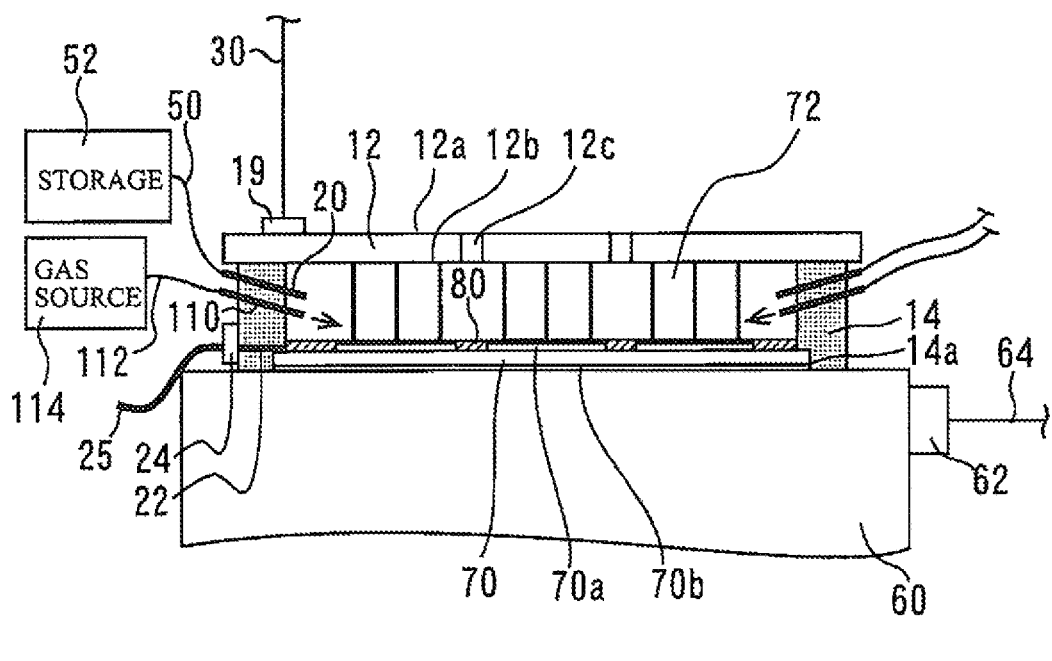
FIG. 11 is a sectional view showing a measuring apparatus according to the third embodiment.

FIG. 11 is a sectional view showing a state where the discharge step is executed by using a measuring apparatus according to the third embodiment. A volatile insulating liquid is stored in the storage 52. A gas supply tube 110 for blowing a gas to the insulating liquid in the measurement region 72 is provided in the side wall part 14. The gas supply tube 110 is connected to a gas source 114 through a hose 112. The gas source 114 supplies a high-pressure gas (preferably at a gauge pressure equal to or higher than 10 kgf/cm$^2$ at ordinary temperature). The gas source 114 supplies an inert gas such as nitrogen gas or argon gas, avoiding reaction of the gas from the gas source 114 with the object to be measured 70.

In the discharge step, the high-pressure gas is blown from the gas source 114 to the insulating liquid 80 through the hose 112 and the gas supply tube 110. This promotes evaporation of the insulating liquid 80. Vapor of the insulating liquid is exhausted out of the measurement region 72 through the discharge tube 22 or the through hole 12c.

The supply tubes 20 and the gas supply tube 110 may be provided in the insulating base plate 12. Since the supply tubes 20 and the gas supply tube 110 are not simultaneously used, a gas/liquid supply tube to be used in common as supply tube 20 and as gas supply tube 110 may be provided. That is, the gas/liquid supply tube may be connected to the storage 52 when the insulating liquid is supplied to the measurement region 72, and connected to the gas source 114 when the gas is exhausted. In such a case, there is a need for a switching part for connecting the gas/liquid supply tube to the storage 52 or the gas source 114. The switching part is under the control of the measuring unit.

Fourth Embodiment

Figure 12:
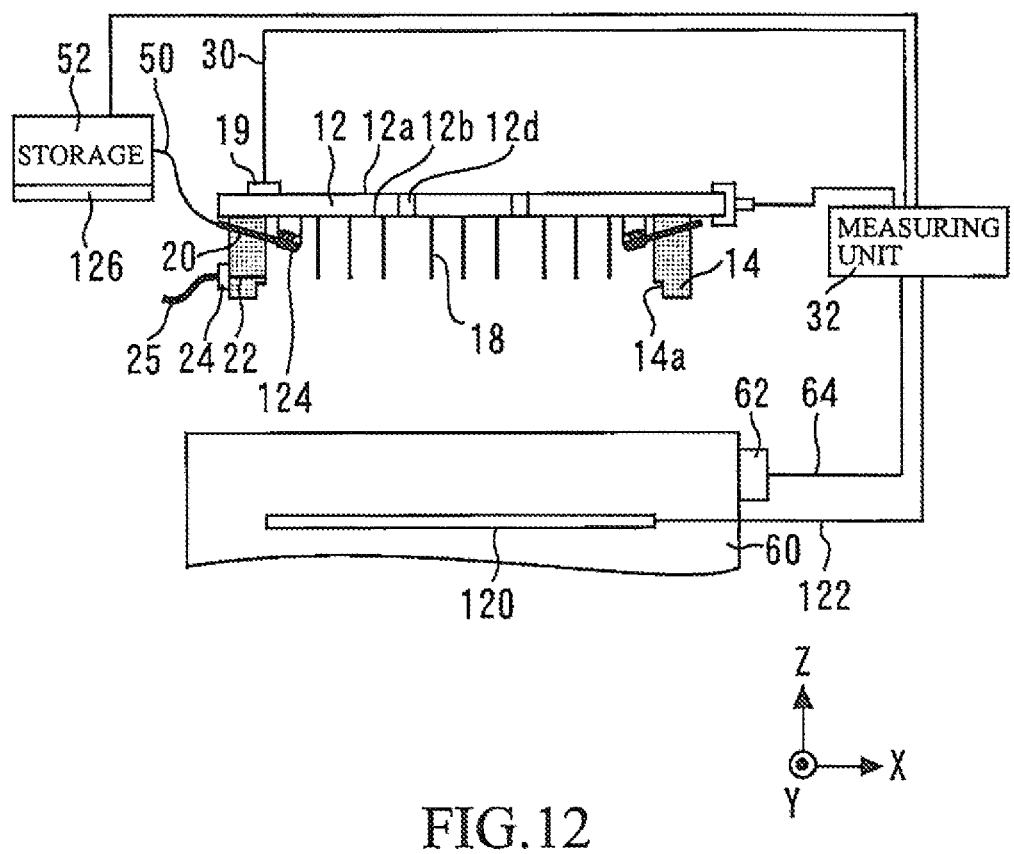
FIG. 12 is a sectional view of a measuring apparatus according to the fourth embodiment.

FIG. 12 is a sectional view of a measuring apparatus according to the fourth embodiment. This measuring apparatus is provided with a stage temperature control part 120 for controlling the temperature of the stage 60. The stage temperature control part 120 is connected to the measuring unit 32 by a signal line 122 and changes the temperature of the stage 60 according to a command from the measuring unit 32.

An application-time temperature control part 124 is attached to each supply tube 20. A storage-time temperature control part 126 is attached to the storage 52. The application-time temperature control part 124 and the storage-time temperature control part 126 are parts for changing the temperature of the insulating liquid under the control of the measuring unit 32. The application-time temperature control part 124 and the storage-time temperature control part 126 will be referred to collectively as liquid temperature control parts.

In some cases, an electrical characteristic of an object to be measured maintained at a desired temperature is measured. In such a case, if the temperature of an object to be measured is changed to reach a desired temperature in the measuring step, it takes considerable time to complete the measuring step. Therefore, the temperature of the object to be measured is made equal to the desired temperature at a stage before the measuring step. However, if the insulating liquid at a temperature different from the desired temperature is applied to the object to be measured in the application step, it takes considerable time to make the temperature of the object to be measured equal to the desired temperature.

In the fourth embodiment of the present invention, therefore, the insulating liquid whose temperature is made equal to the desired temperature is applied to the object to be measured in the application step. More specifically, the temperature of the insulating liquid in the storage 52 is made equal to the desired temperature by the storage-time temperature control part 126. Further, the temperature of the insulating liquid having deviated from the desired temperature as a result of passage through the hose 50 and the supply tube 20 is again made equal to the desired temperature by the application-time temperature control part 124. A change in temperature of the object to be measured when the insulating liquid is applied to the object to be measured can thereby be reduced to shorten the measurement time.

Each of the application-time temperature control part 124 and the storage-time temperature control part 126 is constituted by a heater in a case where there is a need to increase the temperature of the insulating liquid, or by a Peltier element for example in a case where there is a need to reduce the temperature of the insulating liquid. The liquid temperature control part is not particularly specified as long as it is a part capable of controlling the temperature of the insulating liquid before application to the object to be measured. Therefore, one of application-time temperature control part 124 and the storage-time temperature control part 126 may be removed.

Fifth Embodiment

Figure 13:
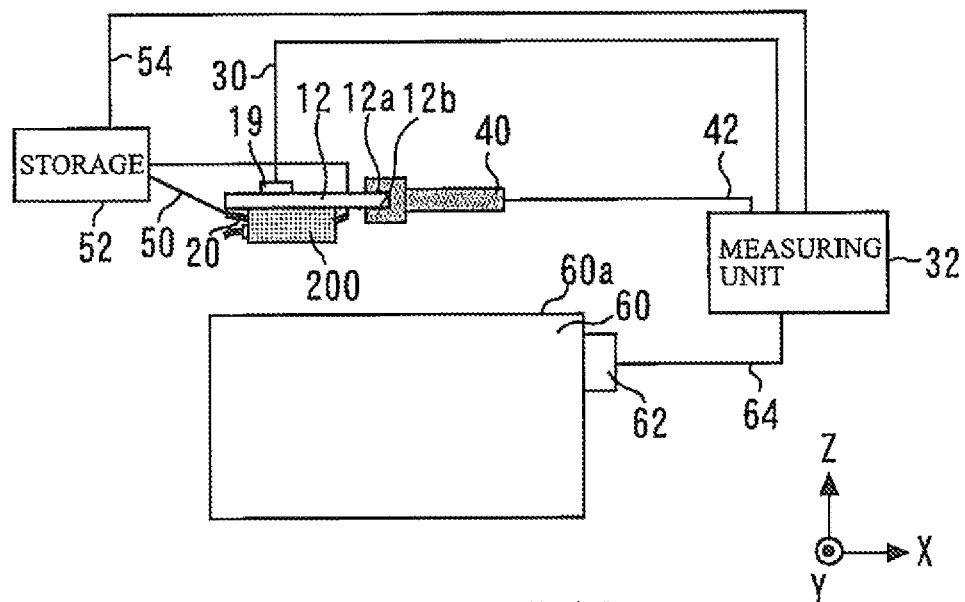
FIG. 13 is a front view of a measuring apparatus according to the fifth embodiment.

FIG. 13 is a front view of a measuring apparatus according to the fifth embodiment of the present invention. This measuring apparatus has a side wall part 200, which is smaller in width than the side wall part 14 in the first embodiment.

Figure 14:
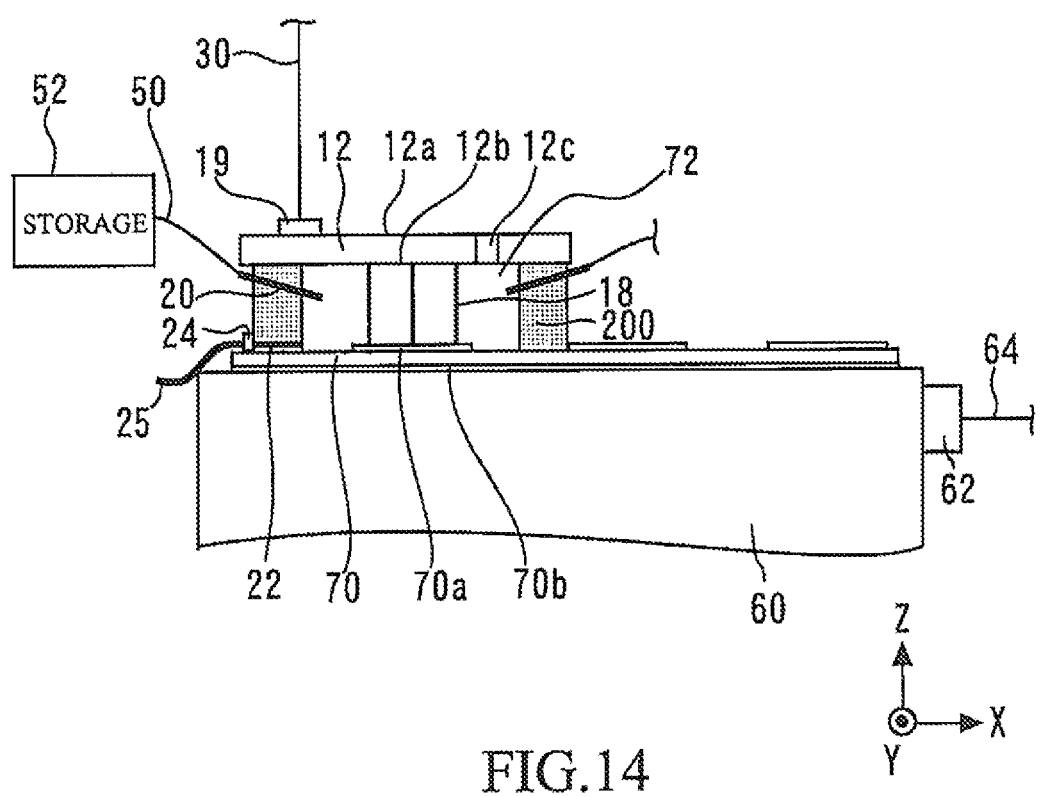
FIG. 14 is a sectional view including portions of the measuring apparatus after the contact step.

A measuring method according to the fifth embodiment will be described. First, in the mount step, the object to be measured 70 in which a plurality of elements each having an upper electrode are formed is placed on the stage 60. The process then advances to the contact step. FIG. 14 is a sectional view including portions of the measuring apparatus after the contact step. In the contact step, probes 18 are brought into contact with the upper electrode 70a of an elemental measurement object ("elemental measurement object" referring to the element which the probes 18 contact in the contact step, in the following description as well). The elemental measurement object is one element in this embodiment.

Figure 15:
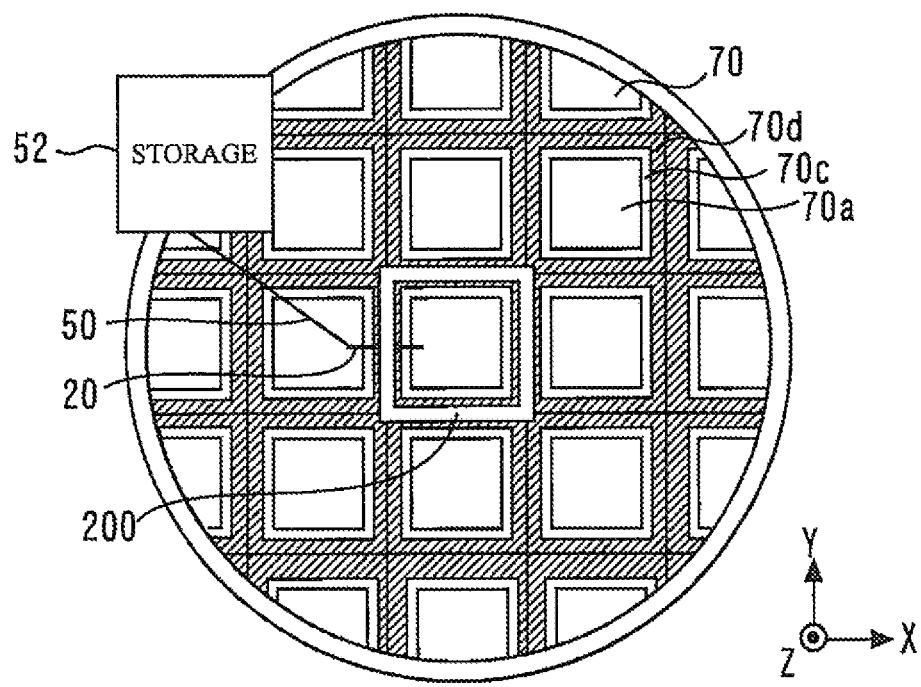
FIG. 15 is a plan view of the side wall part and the object to be measured after the contact step.

FIG. 15 is a plan view of the side wall part 200 and the object to be measured 70 after the contact step. One element has the upper electrode 70a, a terminal region 70c where a guard ring or the like surrounding the upper electrode 70a is formed and a dicing line 70d. The terminal region 70c and the dicing line 70d form a peripheral portion of the element. The side wall part 200 is brought into contact with this peripheral portion.

Referring back to FIG. 14, in the contact step, the lower surface of the side wall part 200 is brought into contact with the peripheral portion of the elemental measurement object, with the probes 18 brought into contact with the upper electrode 70a. As a result, the upper electrode 70a of the elemental measurement object is surrounded with the side wall part 200 and the insulating base plate 12 in contact with the upper surface of the side wall part 200.

Subsequently, the process advances to the application step and the insulating liquid is applied to the elemental measurement object. The process then advances to the measuring step and an electrical characteristic of the elemental measurement object is measured by the measuring unit 32 electrically connected to the probes 18. The process then advances to the discharge step and the insulating liquid is discharged through the discharge tube 22. This sequence of process steps are executed on each element to measure the electrical characteristics of all the elements in the object to be measured 70.

The insulating liquid is applied to the entire object to be measured in the application step in the first embodiment. In the application step in the first embodiment, therefore, difficulty may occur in applying the insulating liquid to some portions of the object to be measured, depending on the positions of the supply tubes, and the amount of insulating liquid applied may have to be increased. However in the fifth embodiment of the present invention, application nonuniformity does not occur easily even when the amount of the insulating liquid is small, since the insulating liquid is applied to the elemental measurement object, i.e., one element. The amount of the insulating liquid used can therefore be reduced. Moreover, since the side wall part 200 is placed on the peripheral portion of the elemental measurement object, the elemental measurement object and the stage 60 can be maintained in close contact with each other, thereby stabilizing the electrical characteristic during measurement.

Figure 16:
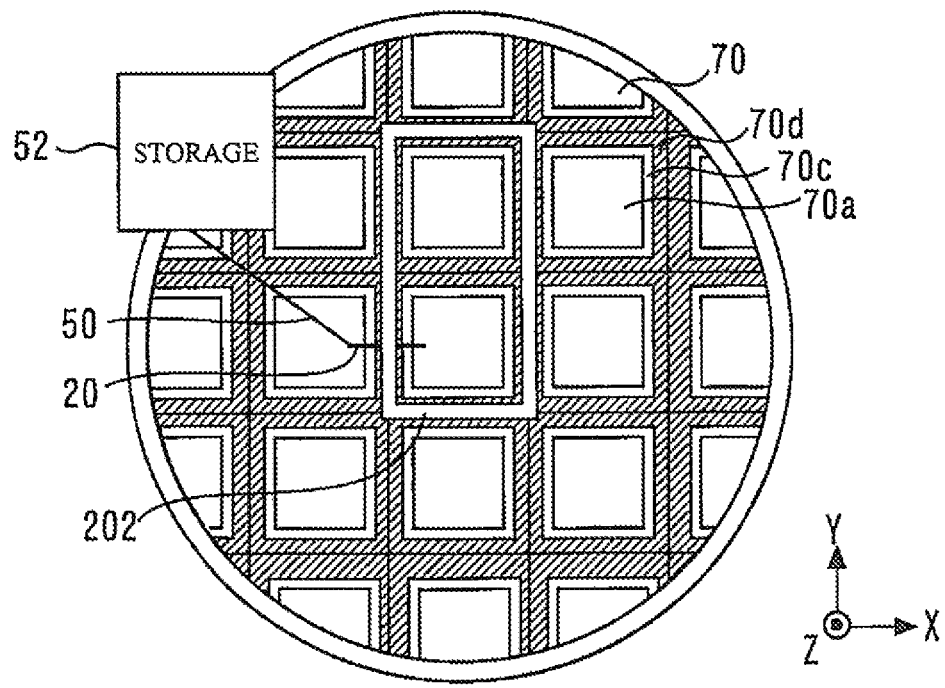
FIG. 16 shows example of modification of side wall part.

In the fifth embodiment of the present invention, the elemental measurement object is one element. However, the present invention is not limited to this. That is, the elemental measurement object is not particularly specified as long as the side wall part surrounds not all the plurality of elements formed in the object to be measured but the elemental measurement object which is at least one element as viewed in plan. For example, one side wall part 202 may surround two elements, as shown in FIG. 16. In this case, one measurement region is provided for the two elements.

Figure 17:
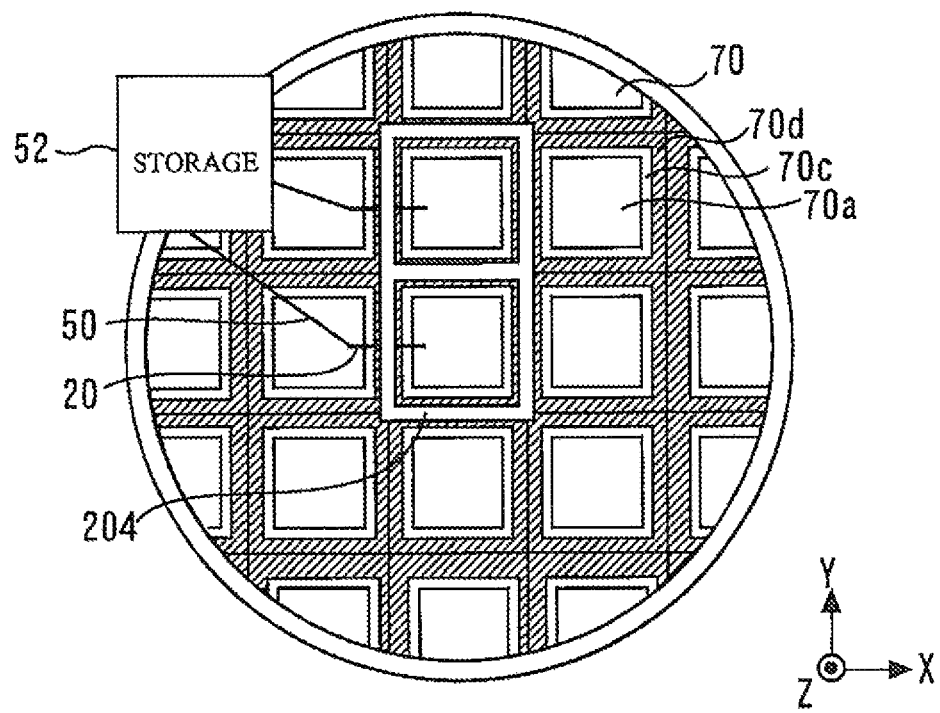
FIG. 17 shows another example of modification of side wall part.

Further, two elements may be individually surrounded by one side wall part 204, as shown in FIG. 17. In this case, measurement regions are separately provided for the two elements. Use of the side wall part 204 having such a shape as to form a plurality of measurement regions enables executing the contact step on a plurality of elements at a time as well as maintaining the elemental measurement object and the stage 60 in close contact with each other. Setting two or more elements as elemental measurement object ensures that the measurement time can be shortened in comparison with the case where the elemental measurement object is one element. For this effect, the provision of a side wall part having such a shape as to separately surround each of the elements in the elemental measurement object as viewed in plan suffices, and separate measurement regions may be provided for three or more elements.

In addition to use of a side wall part having such a shape as to separately surround each of elements in the elemental measurement object, the method of applying the insulating liquid to the elemental measurement object after making the temperature of the insulating liquid equal to the temperature of the object to be measured may be adopted to achieve a further reduction in measurement time.

Sixth Embodiment

Figure 18:
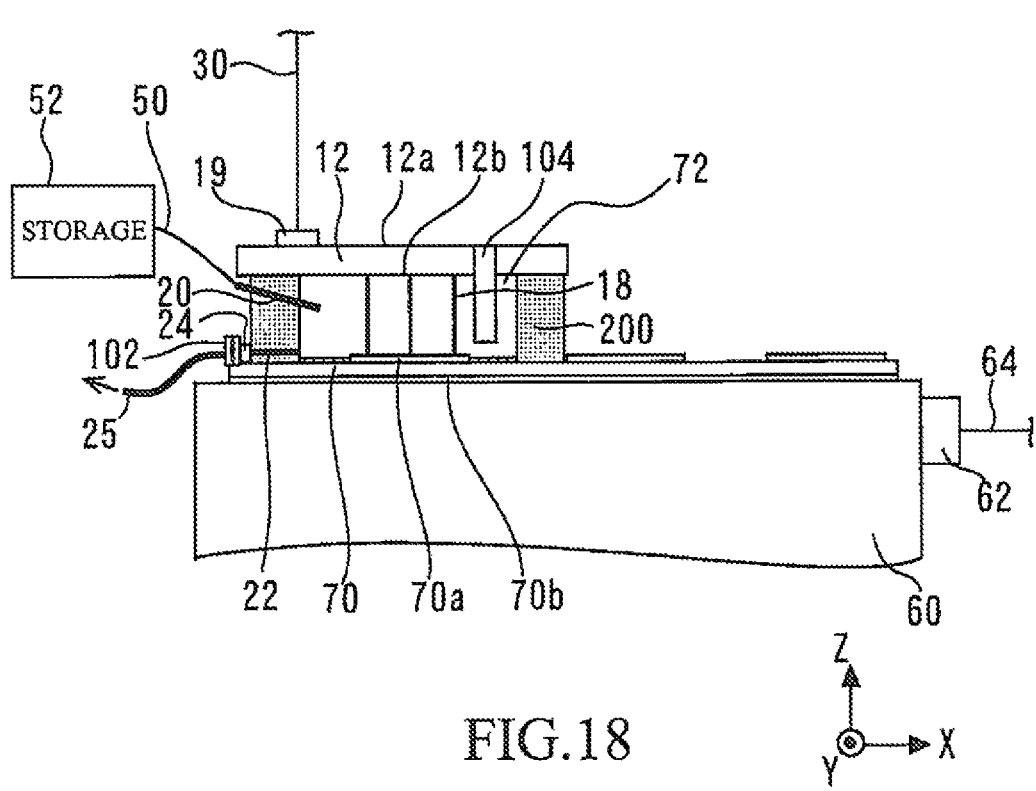
FIG. 18 is a sectional view showing a measuring apparatus according to the sixth embodiment.

FIG. 18 is a sectional view showing a state where the discharge step is executed by using a measuring apparatus according to the sixth embodiment of the present invention. In the sixth embodiment, a volatile insulating liquid is used. After measurement of an electrical characteristic of an elemental measurement object, vapor of the insulating liquid is exhausted to the outside through the discharge tube 22 to which the exhaust fan 102 is attached. Also, external air is applied to the insulating liquid from the external air introducing tube 104 extending from the insulating base plate 12 toward the elemental measurement object.

The measurement region formed by the side wall part 200 is narrower than the measurement region formed by the side wall part 14 in the first embodiment. Therefore, external air introduced from the external air introducing tube 104 into the measurement region can be applied to the entire insulating liquid, thus effectively evaporating the insulating liquid.

Seventh Embodiment

Figure 19:
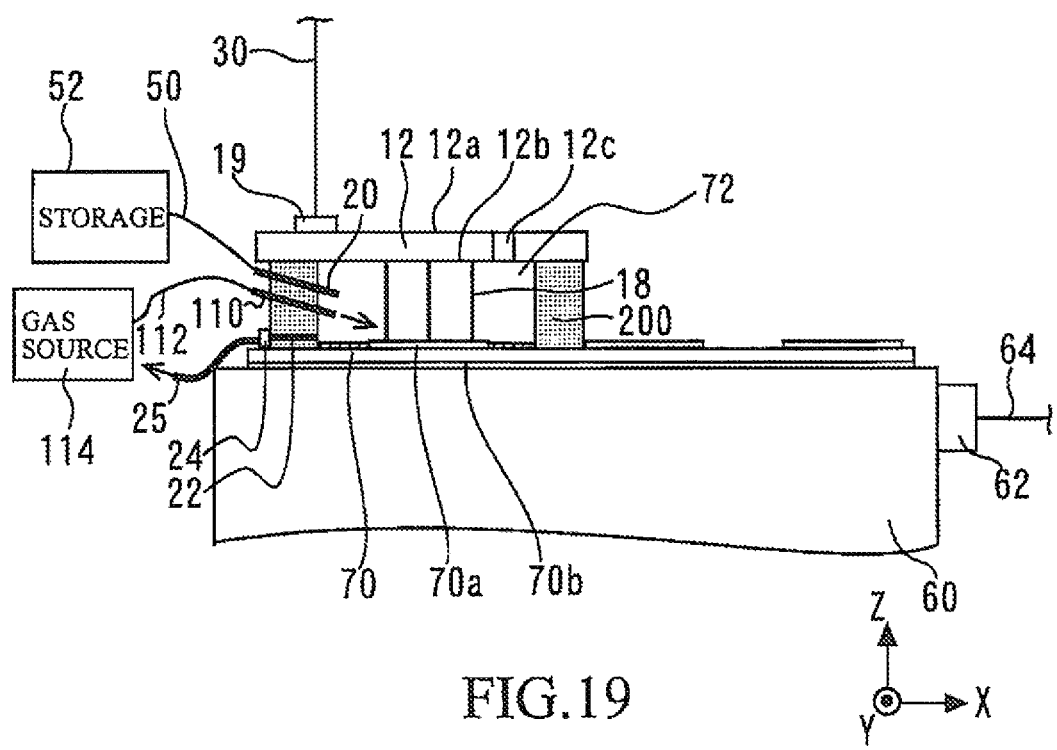
FIG. 19 is a sectional view showing a measuring apparatus according to the seventh embodiment.

FIG. 19 is a sectional view showing a state where the discharge step is executed by using a measuring apparatus according to the seventh embodiment of the present invention. In the seventh embodiment, a volatile insulating liquid is used. After measurement of an electrical characteristic of an elemental measurement object, a gas is blown from the gas source 114 to the insulating liquid, thereby evaporating the insulating liquid.

The measurement region formed by the side wall part 200 is narrower than the measurement region formed by the side wall part 14 in the first embodiment. Therefore, the gas introduced from the gas source 114 into the measurement region can be applied to the entire insulating liquid, thus effectively evaporating the insulating liquid.

Eighth Embodiment

Figure 20:
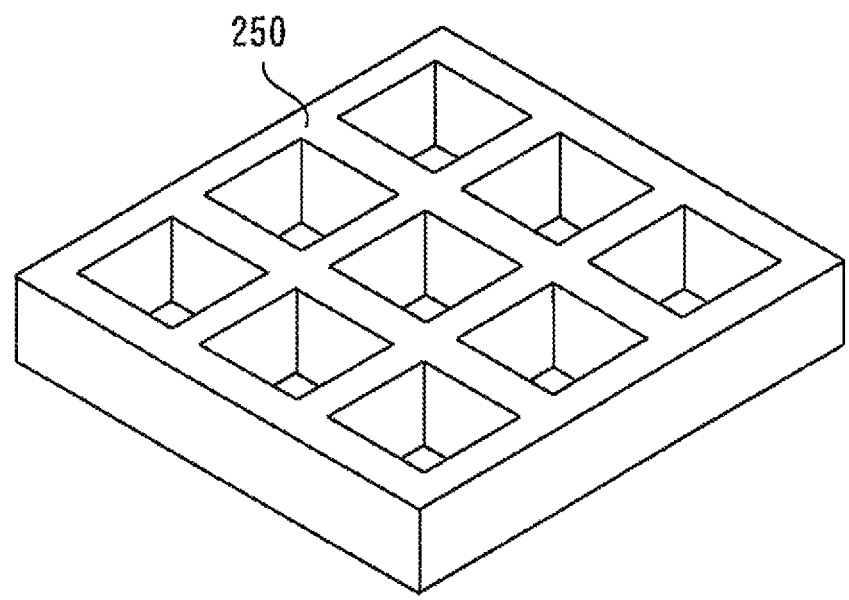
FIG. 20 is a perspective view of the side wall part.
Figure 21:
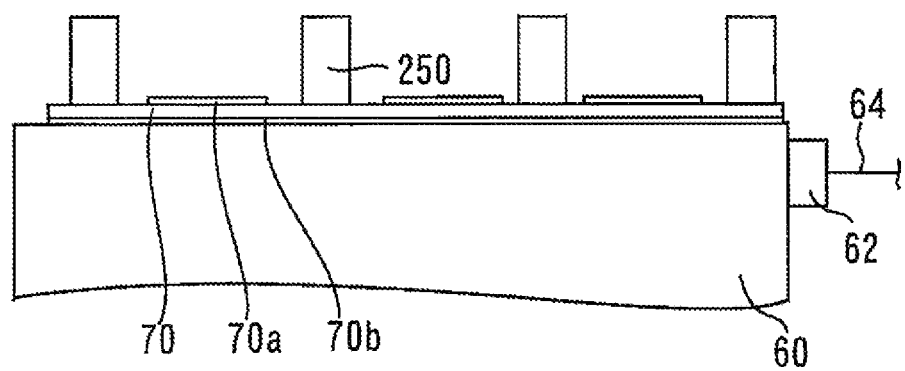
FIG. 21 is a sectional view of side wall part.
Figure 22:
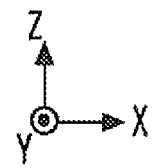
FIG. 22 is a plan view of a portion shown in FIG. 21.
Figure 22:
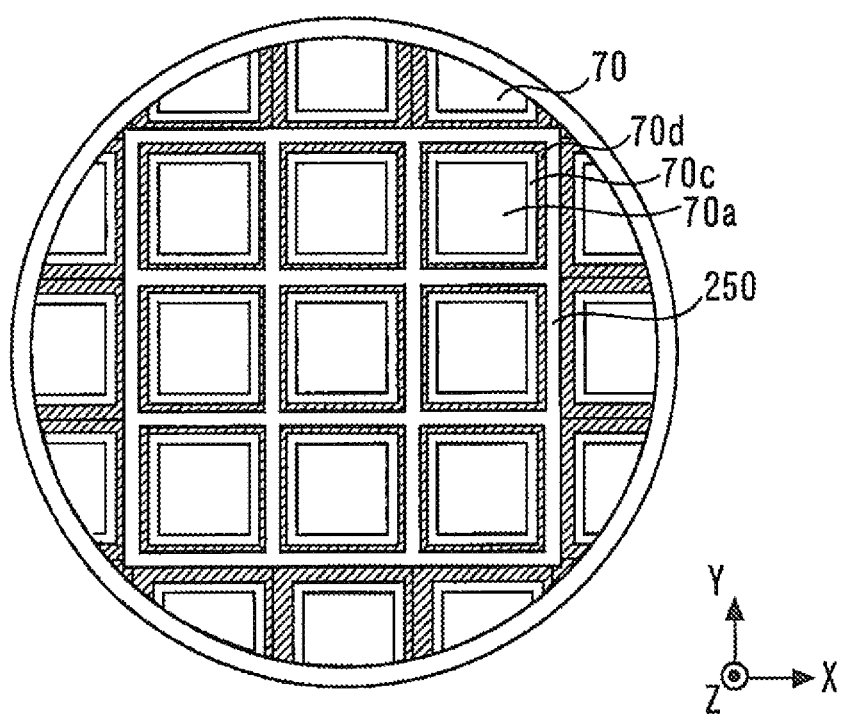

FIG. 20 is a perspective view of a side wall part 250 of a measuring apparatus according to the eighth embodiment. Nine openings are formed in the side wall part 250 to enable provision of nine measurement regions. After the mount step, the side wall part 250 is placed on the object to be measured 70 before the contact step. FIG. 21 is a sectional view including the side wall part 250 in a state where the side wall part 250 is placed on the object to be measured 70. The side wall part 250 is brought into contact with a peripheral portion of an element. FIG. 22 is a plan view of a portion shown in FIG. 21. The side wall part 250 separately surrounds each of the upper electrodes 70a of nine elements to be obtained as a product.

Figure 23:
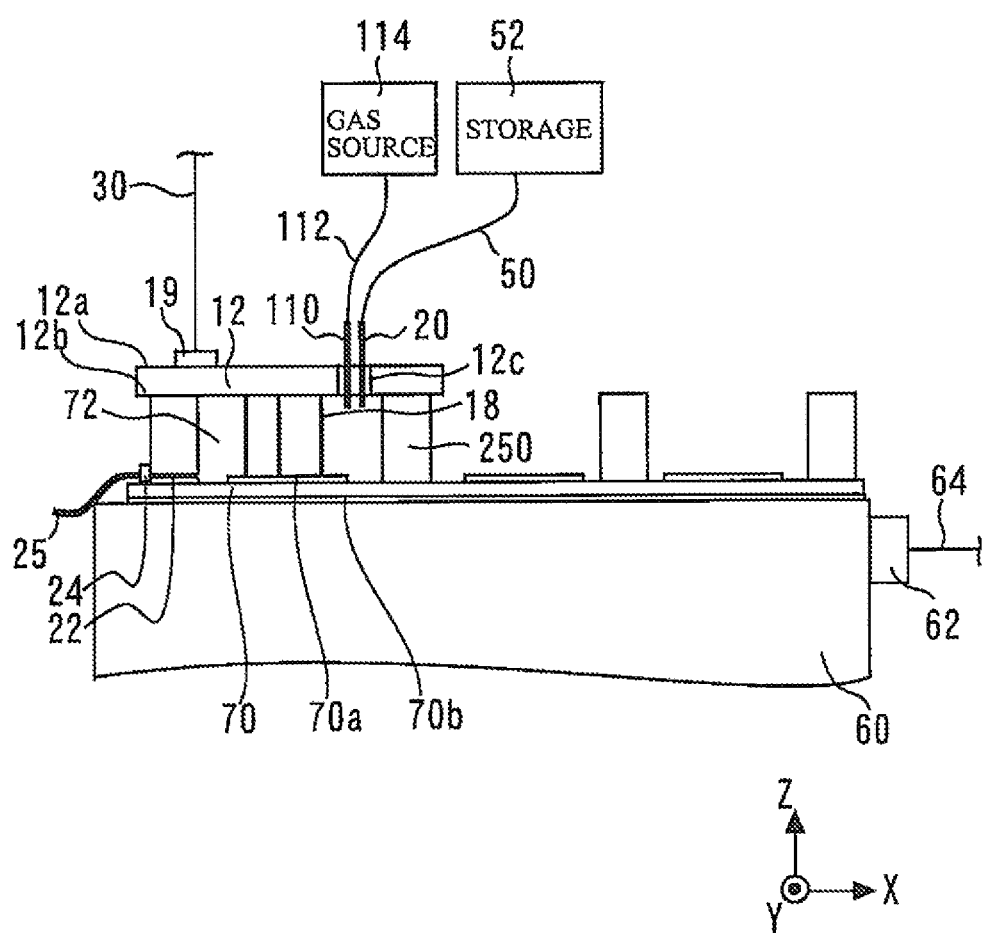
FIG. 23 is a sectional view including the side wall part after the contact step.

The contact step will subsequently be described. FIG. 23 is a sectional view including the side wall part after the contact step. In the contact step, the lower surface 12b of the insulating base plate 12 is brought into contact with the upper surface of the side wall part 250 and the probes 18 are brought into contact with the upper electrode 70a of the elemental measurement object, thereby forming one measurement region 72.

The process then advances to the application step. In the application step, the insulating liquid is applied to the elemental measurement object by means of the supply tube 20 fixed in the insulating base plate 12, the hose 50 and the storage 52. The measuring step is subsequently executed. The process then advances to the discharge step. In the discharge step, a gas is supplied to the measurement region 72 by means of the gas supply tube 110, the hose 112 and the gas source 114, thereby promoting evaporation of the insulating liquid. Also, evaporation of the insulating liquid may be promoted by using an exhaust fan.

This sequence of process steps from the contact step to the discharge step are executed one after another of all the elements, thereby completing the measurement process. In the eighth embodiment of the present invention, the side wall part 250 is not fixed to the insulating base plate 12. Replacement or cleaning of the side wall part 250 is thereby made easier.

A combination of some of the features of the embodiments described above may be made and used as desired.

According to the present invention, the side wall part retaining the insulating liquid is brought into contact with the object to be measured. Therefore, the amount of the insulating liquid used can be reduced and penetration of the insulating liquid to the back surface of the object to be measured can be inhibited.

Obviously many modifications and variations of the present invention are possible in the light of the above teachings. It is therefore to be understood that within the scope of the appended claims the invention may be practiced otherwise than as specifically described.

What is claimed is:

1. A measuring apparatus comprising:
a stage on which an object to be measured is placed;
an insulating base plate;
a probe fixed on the insulating base plate;
a measuring unit which measures an electrical characteristic of the object to be measured through the probe;
a side wall part having such a shape as to surround the probe and smaller in width than the stage; and
a supply tube through which an insulating liquid is supplied,
wherein when an electrical characteristic of the object to be measured is measured, the stage, the side wall part and the insulating base plate form a measurement region surrounding the object to be measured, and the insulating liquid is applied from the supply tube to the object to be measured in the measurement region, and
wherein the supply tube is fixed to the side wall part below the insulating base plate.

2. The measuring apparatus according to claim 1, wherein a plurality of the supply tubes are provided.

3. The measuring apparatus according to claim 2, wherein the plurality of the supply tubes are provided at equal intervals.

4. The measuring apparatus according to claim 2, wherein the plurality of the supply tubes are disposed so as to form a vortex of the insulating liquid in the measurement region.

5. The measuring apparatus according to claim 1, wherein the side wall part is formed of an insulating material, and an inner wall surface of the side wall part is formed of a curved surface.

6. The measuring apparatus according to claim 1, further comprising:
a discharge tube which is fixed in the side wall part, and through which the insulating liquid is discharged out of the measurement region; and
an opening/closing valve which opens and closes the discharge tube.

7. The measuring apparatus according to claim 1, wherein the side wall part and the insulating base plate are fixed to each other, with an upper surface of the side wall part maintained in contact with the insulating base plate, the side wall part and the insulating base plate being fixed by a method enabling the side wall part and the insulating base plate to be separated from each other.

8. The measuring apparatus according to claim 1, wherein a stepped portion is provided in a lower surface of the side wall part.

9. The measuring apparatus according to claim 1, further comprising:
a stage temperature control part for controlling the temperature of the stage; and
a liquid temperature control part for controlling the temperature of the insulating liquid before application to the object to be measured.

10. The measuring apparatus according to claim 1, wherein the side wall part has such a shape as to form a plurality of the measurement regions.

11. A measuring apparatus comprising:
a stage on which an object to be measured is placed;
an insulating base plate;
a probe fixed on the insulating base plate;
a measuring unit which measures an electrical characteristic of the object to be measured through the probe;
a side wall part having such a shape as to surround the probe and smaller in width than the stage;
a supply tube through which an insulating liquid is supplied;
a discharge tube which is provided on the side wall part or the insulating base plate, and through which vapor of the insulating liquid is exhausted out of the measurement region;

an exhaust fan which exhausts a gas in the discharge tube; and an external air introducing tube through which external air is supplied into the measurement region, and which extends from the insulating base plate toward the object to be measured, wherein when an electrical characteristic of the object to be measured is measured, the stage, the side wall part and the insulating base plate form a measurement region surrounding the object to be measured, and the insulating liquid is applied from the supply tube to the object to be measured in the measurement region, and wherein the insulating liquid has volatility.

12. A measuring apparatus comprising:
a stage on which an object to be measured is placed;
an insulating base plate;
a probe fixed on the insulating base plate;
a measuring unit which measures an electrical characteristic of the object to be measured through the probe;
a side wall part having such a shape as to surround the probe and smaller in width than the stage;
a supply tube through which an insulating liquid is supplied; and
a gas supply tube through which a gas is blown to the insulating liquid in the measurement region, the gas supply tube being provided on the side wall part or the insulating base plate,
wherein when an electrical characteristic of the object to be measured is measured, the stage, the side wall part and the insulating base plate form a measurement region surrounding the object to be measured, and the insulating liquid is applied from the supply tube to the object to be measured in the measurement region, and
wherein the insulating liquid has volatility.

13. A method of measuring an object to be measured, comprising the steps of:
placing on a stage an object to be measured in which a plurality of elements each having an upper electrode are formed;
bringing a lower surface of a side wall part surrounding, as viewed in plan, an elemental measurement object which is not all of the plurality of elements but at least one of the elements into contact with a peripheral portion of the elemental measurement object so that the upper electrode of the elemental measurement object is surrounded with the side wall part and an insulating base plate maintained in contact with the upper surface of the side wall part, and bringing a probe fixed on the insulating base plate into contact with the upper electrode of the elemental measurement object;
applying an insulating liquid to the elemental measurement object; and
measuring an electrical characteristic of the elemental measurement object with a measuring unit electrically connected to the probe.

14. The method of measuring the object to be measured according to claim 13, wherein the elemental measurement object is one element.

15. The method of measuring the object to be measured according to claim 13, wherein the elemental measurement object is two or more elements, and the side wall part has such a shape as to separately surround each of the elements in the elemental measurement object as viewed in plan.

16. The method of measuring the object to be measured according to claim 13, wherein the insulating liquid has volatility, and
wherein after the measurement of the electrical characteristic of the elemental measurement object, vapor of the insulating liquid is exhausted to the outside through a discharge tube to which an exhaust fan is attached, and external air is applied to the insulating liquid from an external air introducing tube extending from the insulating base plate toward the elemental measurement object.

17. The method of measuring the object to be measured according to claim 13, wherein the insulating liquid has volatility, and
wherein after the measurement of the electrical characteristic of the elemental measurement object, a gas is blown to the insulating liquid to evaporate the insulating liquid.

18. The method of measuring the object to be measured according to claim 13, wherein the insulating liquid is applied to the elemental measurement object after the temperature of the insulating liquid is made equal to the temperature of the object to be measured.

19. A measuring apparatus comprising:
a stage on which an object to be measured is placed;
an insulating base plate;
a probe fixed on the insulating base plate;
a measuring unit which measures an electrical characteristic of the object to be measured through the probe;
a side wall part having such a shape as to surround the probe and smaller in width than the stage; and
a supply tube through which an insulating liquid is supplied,
wherein when an electrical characteristic of the object to be measured is measured, the stage, the side wall part and the insulating base plate form a measurement region surrounding the object to be measured, and the insulating liquid is applied from the supply tube to the object to be measured in the measurement region, and
wherein the insulating base plate is formed on a top surface of the side wall part.

* * * * *